(12) United States Patent
Manikam et al.

(10) Patent No.: US 7,989,965 B2
(45) Date of Patent: Aug. 2, 2011

(54) UNDERFILL DISPENSING SYSTEM FOR INTEGRATED CIRCUITS

(75) Inventors: Vittal Raja Manikam, Shah Alam (MY); Yit Meng Lee, Kuala Lumpur (MY); Vemal Raja Manikam, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 12/504,654

(22) Filed: Jul. 16, 2009

(65) Prior Publication Data

US 2010/0279471 A1 Nov. 4, 2010

(30) Foreign Application Priority Data

Apr. 30, 2009 (MY) .............................. PI20091759

(51) Int. Cl.
*H01L 21/56* (2006.01)
*B05C 11/08* (2006.01)
(52) U.S. Cl. ................ 257/789; 257/E21.502; 438/127; 438/55; 118/52; 29/841
(58) Field of Classification Search .................... 29/734, 29/737, 740, 743, 752, 832, 841; 118/52, 118/56; 257/100, 433, 667, 787–796, E31.117–E31.118, 257/E51.02, E23.116–E23.14, E21.502; 438/15, 25, 26, 51, 55, 64, 112, 124, 126, 127
See application file for complete search history.

(56) References Cited

U.S. PATENT DOCUMENTS

| | | | |
|---|---|---|---|
| 5,710,071 A | * | 1/1998 | Beddingfield et al. ........ 438/108 |
| 5,906,682 A | | 5/1999 | Bouras et al. |
| 6,895,666 B2 | | 5/2005 | Hong et al. |

OTHER PUBLICATIONS

Chao-Ming Lin, Enhancement of Underfill Capillary Flow in Flip-Chip Packaging by Means of the Inertia Effect, IEEE Transactions on Advanced Packaging, Aug. 2004, p. 533-539, vol. 27, Issue 3.

* cited by examiner

*Primary Examiner* — Matthew Smith
*Assistant Examiner* — Walter H Swanson
(74) *Attorney, Agent, or Firm* — Charles Bergere

(57) ABSTRACT

A system for dispensing an underfill material between an integrated circuit (IC) chip and a substrate includes a platform at which the underfill material is supplied. The IC chip and the substrate are mounted at the periphery of the platform. The platform rotates and facilitates the movement of the underfill material toward the IC chip and the substrate. The system further includes a Bernoulli tube that is located proximate to the IC chip and the substrate. The Bernoulli tube generates a low pressure in the proximity of the IC packages. The low pressure facilitates the dispensing of the underfill material between the IC chip and the substrate.

18 Claims, 5 Drawing Sheets

UNDERFILL DISPENSING SYSTEM FOR INTEGRATED CIRCUITS

BACKGROUND OF THE INVENTION

The present invention relates generally to packaging of integrated circuits (IC), and, more specifically, to a system for dispensing an underfill between an IC chip and a substrate.

Integrated circuits (ICs) are circuits formed on a semiconductor wafer. Prior to being used in an electronic device, the IC must be packaged to protect the IC from being damaged. The package also provides connectors or pins for connecting the IC to other devices. A large variety of IC package configurations and technologies have been developed. Examples of IC package configurations include in-line packages, small outline packages, quad flat pack packages, pin grid array packages, ball grid array packages, and flip chip ball grid array packages. Each packaging technology provides a combination of characteristics such as packaging efficiency, lead count, thermal performance, electrical performance, size, weight, flexibility, and reliability.

Flip chip ball grid array (FCBGA) package configuration is an advanced packaging technology that aids in making the size of the package compact. In an FCBGA package, an IC chip is mounted in an upside-down manner over a substrate, and is electrically coupled to the substrate through multiple bumps provided on an active surface of the IC chip. However, gaps are left between the IC chip and the substrate. Since the IC chip and the substrate have different coefficients of thermal expansion (CTE), any thermal stress generated due to high-temperature conditions may result in breaking or damaging the bumped electrical connections. Therefore, to maintain the reliability of the FCBGA package, it is important to fill the gaps between the IC chip and the substrate.

The gaps between the IC chip and the substrate are usually filled with a non-conductive underfill material such as epoxy and resin. The underfill material protects the bumps from dust, moisture, etc., and provides additional mechanical strength to the IC package. Further, the underfill material between the IC chip and the substrate improves the reliability of the IC package by spreading the thermal stress generated due to the CTE mismatch over the entire area of the IC chip, instead of just over the bumps. Generally, the underfill material is injected between the IC chip and the substrate using a dispenser. The underfill material is then drawn into the gaps by capillary action.

Efficiency of an underfill process is primarily determined by the time required to dispense the underfill material between the IC chip and the substrate. The filling time of the underfill material is further affected by various other factors such as driving force required for dispensing the underfill material and surface friction during the flow of the underfill material. For example, in the dispensing method described above, the surface tension between the bumps is the driving force for the underfill material. However, the surface tension may not be sufficient enough to evenly distribute the underfill material in the gaps. Further, some gaps may still remain unfilled due to the lack of sufficient surface tension required for driving the underfill material. This also may prolong the filling time. Long filling time results in the formation of air bubbles within the gaps that may weaken the structure of the IC package. Further, the method mentioned above does not take into consideration the surface friction during the flow of the underfill material, which further prolongs the filling time. Another important factor in determining the filling time is the viscosity of the underfill material. The viscosity is defined as a measure of the resistance of a fluid to flow. However, the viscosity of the underfill material changes with temperature and the change affects the flow of the underfill material.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1A:
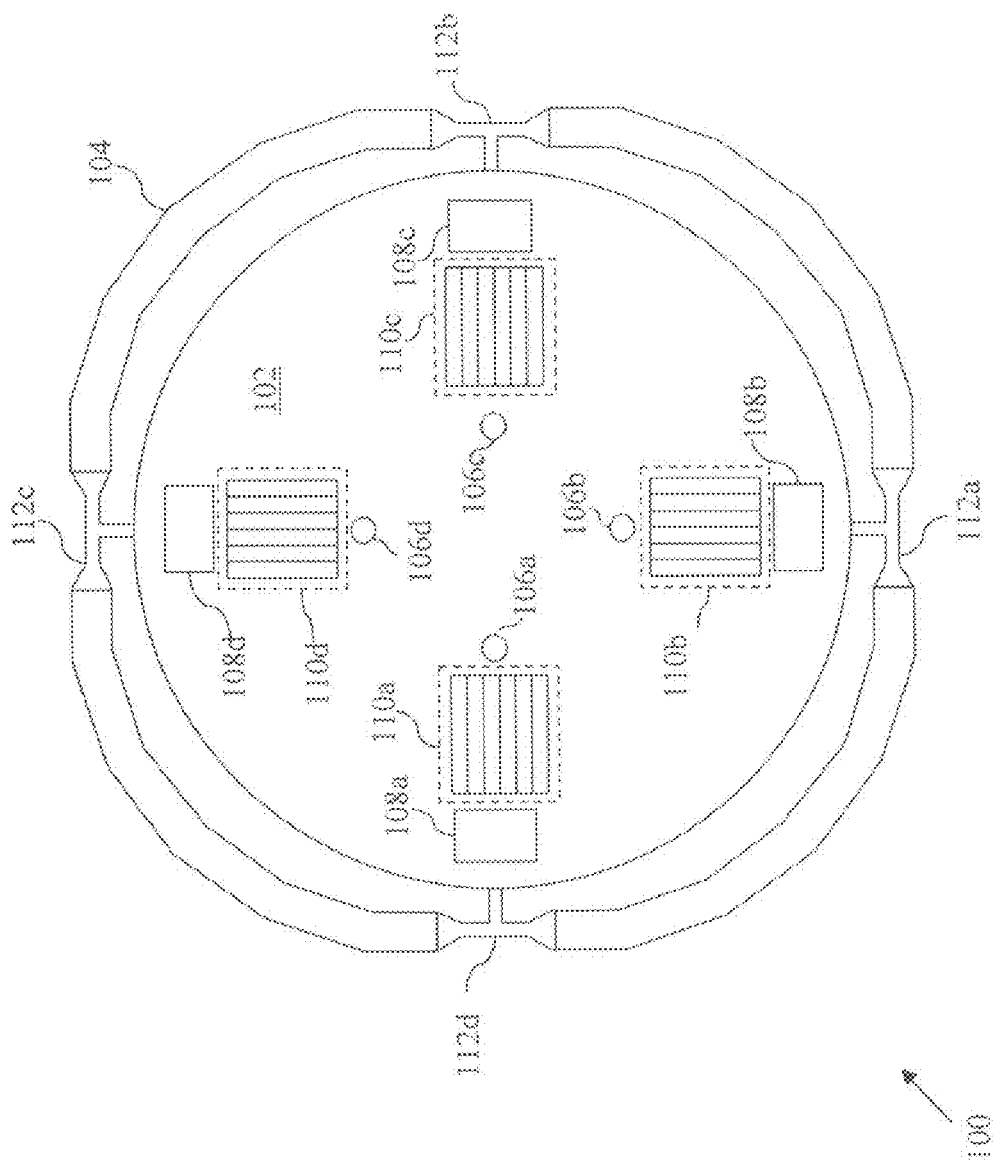
FIG. 1A is a top view of an underfill dispensing system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for dispensing an underfill material between an integrated circuit (IC) chip and a substrate includes a platform. The platform includes one or more spaced outlet ports that are located at a first predetermined distance from a center of a first surface of the platform. The outlet ports dispense the underfill material onto the first surface of the platform. Further, the IC chip and the substrate are mounted at a second predetermined distance from the center of the platform. A means for rotating the platform rotates the platform such that the rotation of the platform facilitates the movement of the underfill material toward the IC chip and the substrate. The system further includes a Bernoulli tube having one or more constriction sections. The constriction sections are located proximal to the IC chip and the substrate. Each of the constriction sections has an opening. A fluid is circulated in the Bernoulli tube to generate a low pressure at the openings. The low pressure at the openings facilitates dispensing of the underfill material between the IC chip and the substrate.

In another embodiment of the present invention, a method for dispensing an underfill material between an integrated circuit (IC) chip and a substrate is provided. The IC chip and the substrate are mounted on a first surface of a platform. The method for dispensing the underfill material includes supplying the underfill material to the first surface of the platform. The platform is rotated to facilitate the movement of the underfill material toward the IC chip and the substrate. A low pressure is generated proximate to the IC chip and the substrate using a fluid circulating in a Bernoulli tube. The low pressure facilitates dispensing of the underfill material between the IC chip and the substrate.

In yet another embodiment of the present invention, a system for dispensing an underfill material between an integrated circuit (IC) chip and a substrate is provided. The system includes a generally circular platform having one or more spaced outlet ports that are located at a first predetermined distance from a center of a first surface of the platform. The outlet ports dispense the underfill material into the first surface of the platform. Further, the IC chip and the substrate are mounted proximate to a periphery of the platform. A means for rotating the platform rotates the platform such that the rotation of the platform facilitates the movement of the underfill material toward the IC chip and the substrate. The system further includes a Bernoulli tube having one or more constriction sections. The constriction sections are located proximate to the IC chip and the substrate. Each of the constriction sections has an opening. A fluid is circulated in the Bernoulli tube to generate a low pressure at the openings. The low pressure at the openings facilitates the dispensing of the underfill material between the IC chip and the substrate. The system also has a heater for heating the underfill material prior to dispensing the underfill material from the outlet ports.

Embodiments of the present invention provide an underfill dispensing system. The angular force generated due to the rotation of the platform overcomes the surface friction between the underfill material and the first surface of the platform, thereby facilitating movement of the underfill material toward the IC chip and the substrate. Further, based on the moment of inertia theorem, the inertia effect induced by the rotation of the platform reduces the surface friction during the flow of the underfill material between the IC chip and the substrate. Therefore, the filling rate of the underfill process is improved, thereby reducing the filling time. Further, the pressure difference generated by the Bernoulli tube forces the underfill material between the IC chip and the substrate, thereby ensuring equal distribution of the underfill material beneath the IC chip. In addition, pre-heating of the underfill material reduces its viscosity, thereby further facilitating the flow of the underfill material. Reduction in the filling time of the underfill material reduces the time and cost of manufacturing the IC packages.

Referring now to FIG. 1A, a schematic diagram illustrating a top view of an underfill dispensing system 100 in accordance with an embodiment of the present invention is shown. The underfill dispensing system 100 includes a platform 102 and a Bernoulli tube 104. In an embodiment of the present invention, the platform 102 is circular in shape. The platform 102 includes a plurality of outlet ports such as outlet ports 106a, 106b, 106c, and 106d, hereinafter referred to as outlet port 106, that are placed near a center of a first surface of the platform 102. The first surface is the top surface of the platform 102. A plurality of IC packages, such as IC packages 108a, 108b, 108c, and 108d, hereinafter referred to as IC package 108, are mounted around a periphery of the platform 102. In various embodiments of the present invention, the IC package 108 may be a flip-chip package. The platform 102 further includes a plurality of insulating tracks such as insulating tracks 110a, 110b, 110c, and 110d, hereinafter referred to as insulating track 110. The insulating track 110 is placed between the outlet port 106 and the IC package 108. The Bernoulli tube 104 includes a plurality of constriction sections such as constriction sections 112a, 112b, 112c, and 112d, hereinafter referred to as constriction section 112. Each constriction section 112 has an opening, and is located proximate to the IC package 108.

Figure 1B:
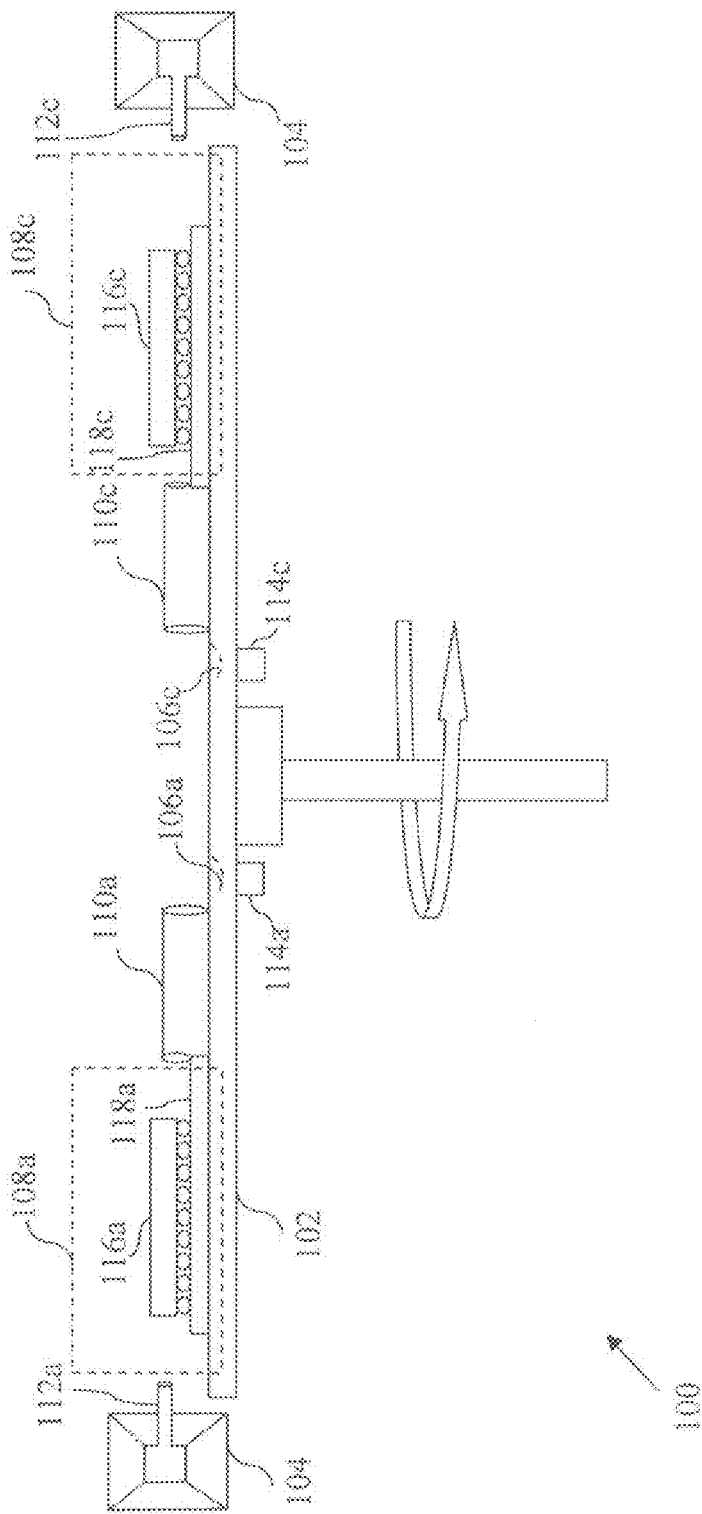
FIG. 1B is a cross-sectional side view of the underfill dispensing system in accordance with an embodiment of the present invention.

Referring now to FIG. 1B, a schematic diagram illustrating a cross-sectional side view of the underfill dispensing system 100 is shown. The underfill dispensing system 100 also includes a plurality of inlet ports such as inlet ports 114a and 114c, hereinafter referred to as an inlet port 114. The inlet port 114 is coupled to the outlet port 106 and is placed on a second surface of the platform 102. The second surface is the bottom surface of the platform 102. As shown in FIG. 1B, each of the IC packages 108 includes an IC chip, such as an IC chip 116a or 116c (hereinafter referred to as IC chip 116), and a substrate, such as a substrate 118a or 118c (hereinafter referred to as substrate 118). The IC chip 116 is mounted in an upside-down manner over the substrate 118 and is electrically coupled to the substrate 118 with a plurality of bumps provided on an active surface of the IC chip 116.

Figure 1C:
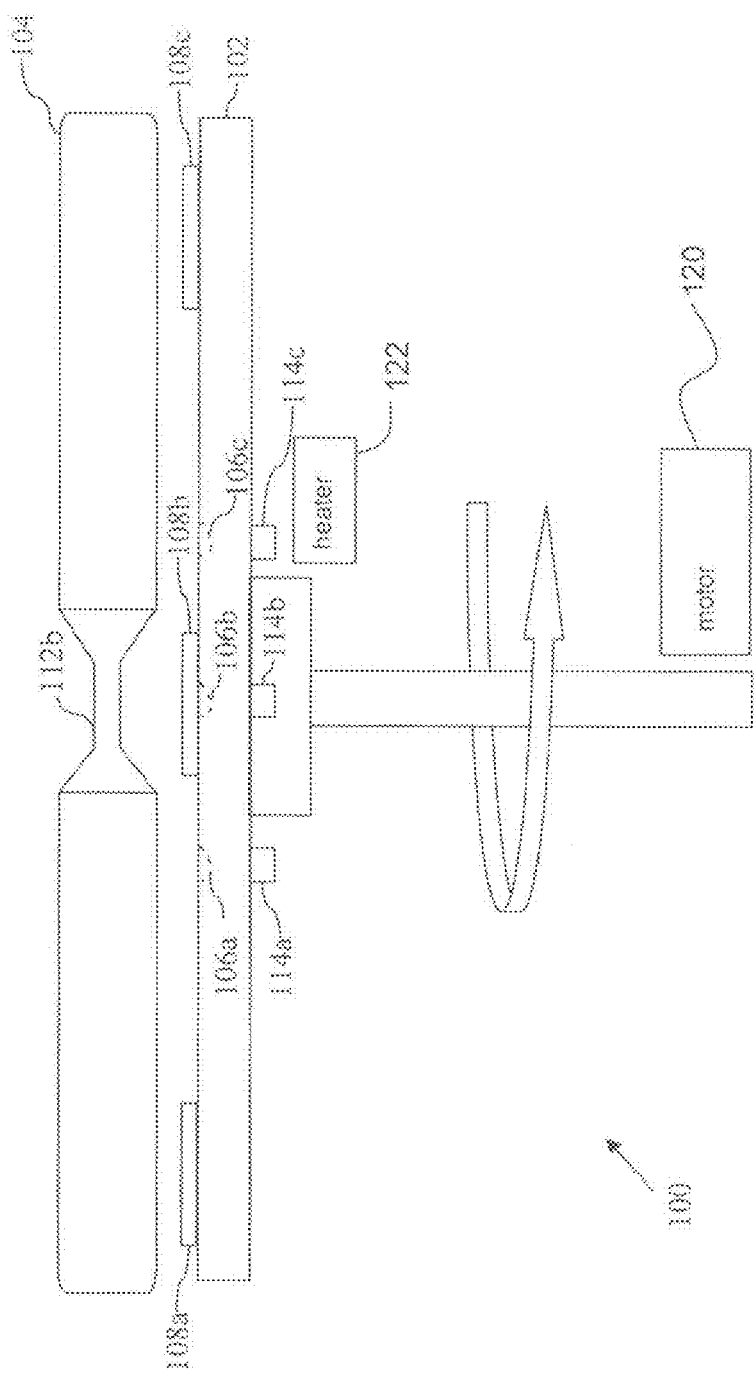
FIG. 1C is a side view of the underfill dispensing system in accordance with an embodiment of the present invention.
Figure 1D:
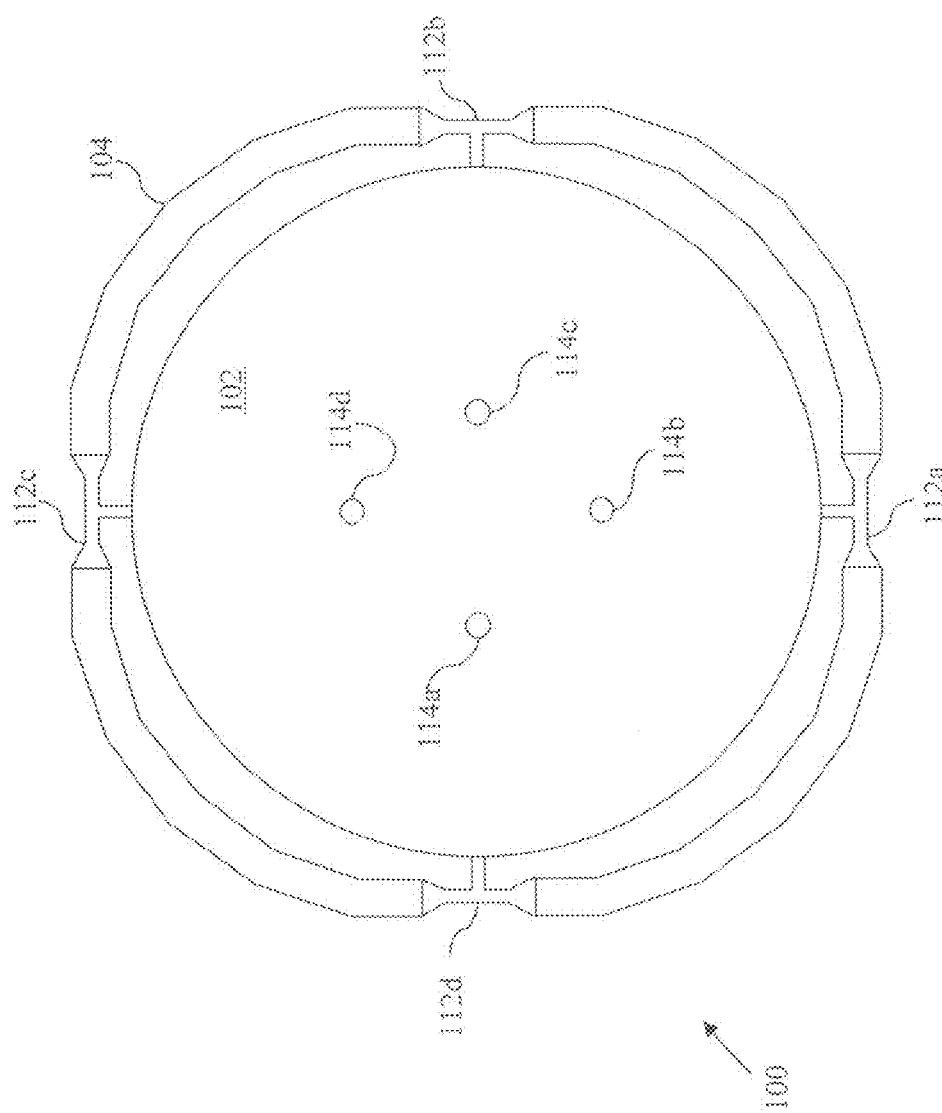
FIG. 1D is a bottom view of the underfill dispensing system in accordance with an embodiment of the present invention.

Referring now to FIGS. 1C and 1D, schematic diagrams illustrating a side view and a bottom view, respectively, of the underfill dispensing system 100 are shown. As discussed above, the platform 102 is rotatable. A means for rotating 120 the platform 102, such as an electric motor, a hydraulic motor, or a pneumatic motor, may be used to provide the torque required for the rotation. The inlet port 114 supplies an underfill material to the outlet port 106. In various embodiments of the present invention, a heater 122 is used to heat the underfill material before it is supplied by the inlet port 114. The pre-heating of the underfill material reduces its viscosity, thereby enhancing the capability of the underfill material to flow. In an embodiment of the present invention, the underfill material is one of a resin, an epoxy, a filler, or a moisture resistant cyanide ester (MRCE). The outlet port 106 dispenses the underfill material to the top surface of the platform 102. In an embodiment of the present invention, the top surface of the platform 102 may be coated by a low friction material such as boron, aluminum and magnesium (BAM) material.

In various embodiments of the present invention, the rotation of the platform 102 provides an angular force to the underfill material. The angular force overcomes the force of friction between the underfill material and the first surface of the platform 102, thereby facilitating the flow of the underfill material toward the IC package 108. Further, the rotation of the platform 102 provides kinetic energy to the underfill material. The kinetic energy further facilitates the flow of the underfill material from the center of the platform 102 to its periphery. The insulating track 110 directs the underfill material toward the IC package 108. In an embodiment of the present invention, the insulating track 110 includes a plurality of ceramic or copper tubes. The inner surface of the tubes may be coated with a low friction material such as the BAM material. Thus, the insulating track 110 prevents dissipation of heat of the underfill material and provides a low friction path for the flow of the underfill material.

A fluid such as air is circulated in the Bernoulli tube 104 to generate a low pressure at an opening of the constriction section 112. In an embodiment of the present invention, a pump circuit (not shown) controls the pressure generated at the opening of the constriction section 112 by controlling the velocity of the fluid circulating in the Bernoulli tube 104. The low pressure at the opening of the constriction section 112 facilitates dispensing of the underfill material between the IC chip 116 and the substrate 118 of the IC package 108. The underfill material is then evenly dispensed between the IC chip 116 and the substrate 118 to fill the gaps.

Figure 2:
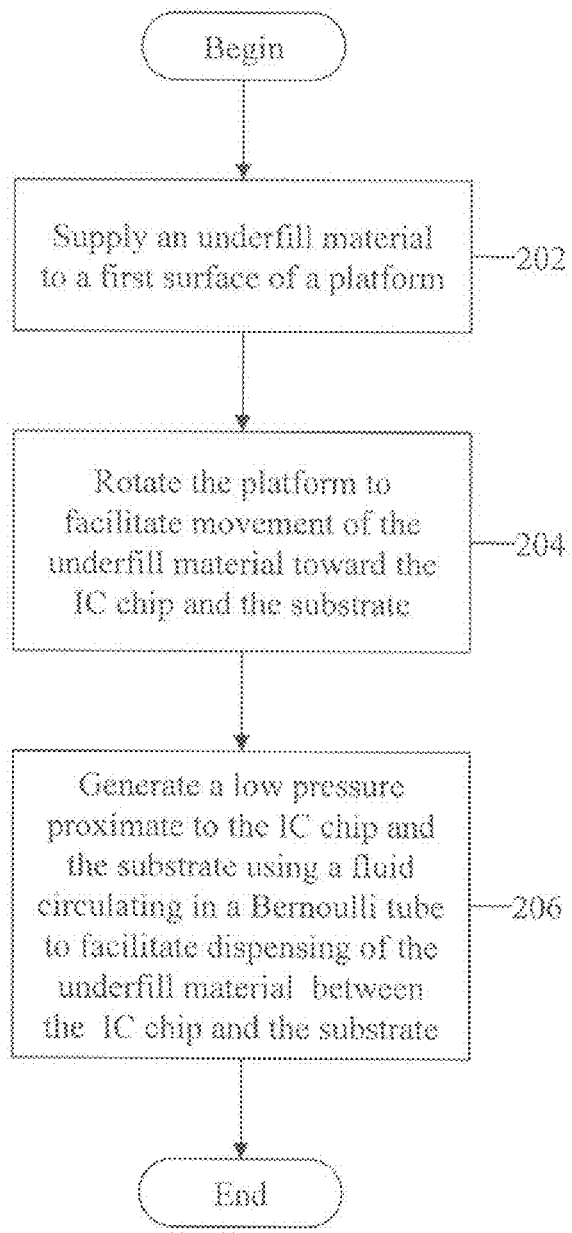
FIG. 2 is a flowchart illustrating a method for dispensing an underfill material between an integrated circuit (IC) chip and a substrate in accordance with another embodiment of the present invention.

Referring now to FIG. 2, a flowchart illustrating a method for dispensing an underfill material between an integrated circuit (IC) chip and a substrate is shown. The IC chip and the substrate are mounted on a first surface of a platform, such as the platform 102 discussed above. In an embodiment of the present invention, the IC chip and the substrate are located near a periphery of the platform. In another embodiment of the present invention, the first surface is coated with a low friction material such as BAM material.

At step 202, the underfill material is supplied to the first surface of the platform. In an embodiment of the present invention, the underfill material is supplied from a location between the IC chip and the substrate and a center of the platform. In various embodiments of the present invention, the underfill material is heated prior to supplying it to the first surface of the platform. At step 204, the platform is rotated to facilitate the flow of the underfill material toward the IC chip and the substrate. In an embodiment of the present invention, the platform is rotated with a motor, as discussed above in conjunction with FIGS. 1A-1D. The movement of the underfill material from the center of the platform to the IC chip and the substrate is directed by way of an insulating track, such as the insulating track 110. In various embodiments of the present invention, the rotation of the platform provides an angular force to the underfill material, thereby overcoming the force of friction between the first surface and the underfill material. Further, based on the moment of inertia theorem, the inertia effect induced by the rotation of the platform reduces the surface friction during the flow of the underfill material between the IC chip and the substrate.

At step 206, a low pressure is generated proximate to the IC chip and the substrate using a fluid circulated in a Bernoulli tube. In an embodiment of the present invention, a pump circuit is used to control the pressure generated proximate to the IC chip and the substrate by controlling the velocity of the fluid circulating in the Bernoulli tube. The low pressure generated in the proximity of the IC chip and the substrate facilitates dispensing of the underfill material between the IC chip and the substrate.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for dispensing an underfill material between an integrated circuit (IC) chip and a substrate, comprising:
   a platform having one or more spaced outlet ports located at a first distance from a center of a first surface of the platform, wherein the underfill material is dispensed from the outlet ports onto the first surface of the platform, and wherein the IC chip and the substrate are mounted at a second distance from the center of the first surface;
   means for rotating the platform such that rotation of the platform facilitates movement of the underfill material toward the IC chip and the substrate; and
   a Bernoulli tube having one or more constriction sections, the constriction sections located proximate to the IC chip and the substrate, wherein each of the constriction sections has an opening, wherein a fluid is circulated in the Bernoulli tube to generate a low pressure at the openings, and wherein the low pressure at the openings facilitates dispensing of the underfill material between the IC chip and the substrate.

2. The system for dispensing an underfill material of claim 1, further comprising one or more inlet ports coupled to the outlet ports and located on a second surface of the platform, for supplying the underfill material to the outlet ports.

3. The system for dispensing an underfill material of claim 1, further comprising one or more insulating tracks located between the outlet ports and the IC chip and the substrate, for directing the underfill material toward the IC chip and the substrate.

4. The system for dispensing an underfill material of claim 3, wherein the one or more insulating tracks comprises a plurality of ceramic tubes.

5. The system for dispensing an underfill material of claim 4, wherein an inner surface of the ceramic tubes is coated with a low friction material.

6. The system for dispensing an underfill material of claim 5, wherein the low friction material includes at least one of Boron, Aluminum and Magnesium.

7. The system for dispensing an underfill material of claim 1, further comprising a pump circuit for controlling a velocity of the fluid circulating in the Bernoulli tube.

8. The system for dispensing an underfill material of claim 7, wherein the fluid comprises air.

9. The system for dispensing an underfill material of claim 1, further comprising a heater for heating the underfill material prior to dispensing the underfill material from the outlet ports.

10. The system for dispensing an underfill material of claim 1, wherein the underfill material comprises at least one of a resin, an epoxy, a filler, and a Moisture Resistant Cyanide Ester (MRCS).

11. The system for dispensing an underfill material of claim 1, wherein the platform is circular in shape.

12. A method for dispensing an underfill material between an integrated circuit (IC) chip and a substrate, wherein the IC chip and the substrate are mounted on a first surface of a platform, comprising:
   supplying the underfill material to the first surface of the platform;
   rotating the platform to facilitate movement of the underfill material toward the IC chip and the substrate;
   generating a low pressure proximate to the IC chip and the substrate using a fluid circulating in a Bernoulli tube, wherein the low pressure facilitates dispensing of the underfill material between the IC chip and the substrate; and
   directing the underfill material from a center of the platform toward the IC chip and the substrate by way of an insulating track.

13. The method for dispensing an underfill material of claim 12, wherein the IC chip and the substrate are located near a periphery of the platform and the underfill material is supplied from a location between the IC chip and the substrate and the center of the platform.

14. The method for dispensing an underfill material of claim 12, further comprising controlling a velocity of the fluid circulating in the Bernoulli tube with a pump circuit.

15. The method for dispensing an underfill material of claim 12, further comprising heating the underfill material prior to supplying the underfill material to the first surface of the platform.

16. A system for dispensing an underfill material between an integrated circuit (IC) chip and a substrate, comprising:
   a generally circular platform having one or more spaced outlet ports located at a first distance from a center of a first surface of the platform, wherein the IC chip and the substrate are mounted proximate to a periphery of the platform, and wherein the underfill material is dispensed from the outlet ports onto the first surface of the circular platform;

means for rotating the circular platform such that rotation of the circular platform facilitates movement of the underfill material toward the IC chip and the substrate;

a Bernoulli tube having one or more constriction sections, the constriction sections located proximate to the IC chip and the substrate, wherein each of the one or more constriction sections has an opening, wherein a fluid is circulated in the Bernoulli tube to generate a low pressure at the openings that facilitates dispensing of the underfill material between the IC chip and the substrate; and a heater for heating the underfill material prior to dispensing the underfill material from the outlet ports.

17. The system for dispensing an underfill material of claim 16, further comprising a pump circuit for controlling a velocity of the fluid circulating in the Bernoulli tube, and wherein the fluid circulating in the Bernoulli tube comprises air.

18. The system for dispensing an underfill material of claim 16, further comprising one or more insulating tracks located between the outlet ports and the IC chip and the substrate, for directing the underfill material toward the IC chip and the substrate.

* * * * *